United States Patent [19]

Green et al.

[11] 4,299,938

[45] Nov. 10, 1981

[54] PHOTOPOLYMERIZABLE AND THERMALLY POLYMERIZABLE COMPOSITIONS

[75] Inventors: George E. Green, Stapleford; Edward Irving, Burwell, both of England

[73] Assignee: Ciba-Geigy Corporation, Ardsley, N.Y.

[21] Appl. No.: 157,766

[22] Filed: Jun. 9, 1980

[30] Foreign Application Priority Data

Jun. 19, 1979 [GB] United Kingdom ............... 21380/79
Feb. 27, 1980 [GB] United Kingdom ................ 6626/80

[51] Int. Cl.$^3$ .......................... C08F 4/00; C08G 8/10; C08G 12/12; C08G 59/68
[52] U.S. Cl. ................. 526/192; 204/159.11; 204/159.24; 525/337; 525/341; 525/343; 525/505; 526/193; 526/195; 526/222; 528/89; 528/90; 528/138; 528/139; 528/141; 528/143; 528/236; 528/240; 528/242; 528/361; 528/408; 528/409
[58] Field of Search ................ 528/89, 90, 361, 408, 528/409, 236, 240, 242, 138, 139, 141, 143; 526/192, 193, 195, 222; 525/337, 341, 343

[56] References Cited

U.S. PATENT DOCUMENTS

| | | | |
|---|---|---|---|
| 3,708,296 | 1/1973 | Schlesinger | 96/33 |
| 3,989,644 | 11/1976 | Bolon et al. | 252/514 |
| 4,032,673 | 6/1977 | Schroeter et al. | 427/54 |
| 4,058,400 | 11/1977 | Crivello | 96/86 |
| 4,058,401 | 11/1977 | Crivello | 96/115 R |
| 4,069,054 | 1/1978 | Smith | 96/115 P |
| 4,081,276 | 3/1978 | Crivello | 96/27 |
| 4,085,019 | 4/1978 | Green | 204/159.23 |
| 4,090,936 | 5/1978 | Barton | 204/159.14 |
| 4,101,513 | 7/1978 | Fox et al. | 526/193 |
| 4,102,687 | 7/1978 | Crivello | 96/115 R |
| 4,105,806 | 8/1978 | Watt | 427/44 |
| 4,108,747 | 8/1978 | Crivello | 204/159.18 |
| 4,113,895 | 9/1978 | Watt et al. | 427/44 |
| 4,136,102 | 1/1979 | Crivello | 260/440 |
| 4,138,255 | 2/1979 | Crivello | 96/35.1 |
| 4,139,385 | 2/1979 | Crivello | 96/35.1 |
| 4,154,872 | 5/1979 | Tsao et al. | 427/44 |
| 4,156,035 | 5/1979 | Tsao et al. | 427/44 |
| 4,156,046 | 5/1979 | Lien et al. | 428/220 |
| 4,161,405 | 7/1979 | Crivello | 96/35.1 |
| 4,161,478 | 7/1979 | Crivello | 260/327 B |
| 4,173,476 | 11/1979 | Smith et al. | 430/280 |
| 4,186,108 | 1/1980 | Carlson et al. | 252/426 |
| 4,216,288 | 8/1980 | Crivello | 430/280 |
| 4,230,814 | 10/1980 | Crivello | 526/333 |

FOREIGN PATENT DOCUMENTS

| | | |
|---|---|---|
| 2833648 | 2/1979 | Fed. Rep. of Germany . |
| 1526923 | 10/1978 | United Kingdom . |
| 2041151 | 8/1979 | United Kingdom . |
| 1554389 | 10/1979 | United Kingdom . |
| 1565671 | 4/1980 | United Kingdom . |

OTHER PUBLICATIONS

Chalkley et al., "Synthesis of Aryloxysulphoxonium Salts", *J. Chem. Soc.*, 1970, 682–686.

*Primary Examiner*—Earl A. Nielsen
*Attorney, Agent, or Firm*—Harry Falber

[57] ABSTRACT

Substances (I) capable of being converted into higher-molecular weight materials under the influence of a cationic catalyst, such as 1,2-epoxides, aminoplasts, vinyl monomers or prepolymers, or phenoplasts, are so converted by exposure to actinic irradiation or by heating in the presence of an aryloxysulfoxonium salt of formula

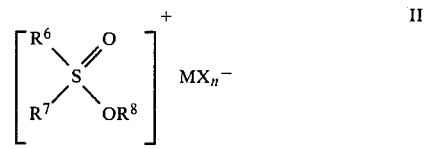

where either $R^6$ and $R^7$ separately denote lower alkyl (optionally substituted by halogen and interrupted in the chain by —O— or —SO$_2$—), or an aryl or aryloxy group, or $R^6$ and $R^7$ together denote a divalent group forming with the S atom a heterocyclic radical; $R^8$ denotes an aryl group; M denotes an atom of a metal or metalloid; X denotes a halogen atom; and n is 4, 5, or 6, for instance, p-chlorophenoxy-p-tolyl-p-phenoxysulfoxonium hexafluorophosphate and 1-phenoxy-1-oxidotetrahydrothiophenium tetrafluorborate.

When I is an epoxide resin or a resol resin, it may be photopolymerized by means of II and subsequently crosslinked with a latent heat-curing agent.

10 Claims, No Drawings

PHOTOPOLYMERIZABLE AND THERMALLY POLYMERIZABLE COMPOSITIONS

This invention relates to compositions comprising a cationically-polymerisable material and an aryloxysulfoxonium salt. It also relates to the polymerization of such compositions by means of actinic radiation and to the optional further crosslinking of photopolymerised products so obtained by means of heat in the presence of heat-curing agents, to the polymerization of such compositions by the effect of heat alone, and to the use of the compositions as surface coatings, in printing plates, in printed circuits, and in reinforced composites, and as adhesives.

For a number of reasons, it has become desirable to induce polymerization of organic materials by means of actinic radiation. Employing photopolymerization procedures may, for example, avoid the use of organic solvents with their attendant risks of toxicity, flammability, and pollution, and the cost of recovering the solvent. Photopolymerization enables insolubilisation of the resin composition to be restricted to defined areas, i.e., those which have been irradiated, and so permits the production of printed circuits and printing plates or allows the bonding of substrates to be confined to required zones. Further, in production processes, irradiation procedures are often more rapid than those involving heating and a consequential cooling step.

It has been known for some years that certain aromatic diazonium salts undergo decomposition on exposure to actinic radiation and that, if the salt is mixed with a cationically-polymerisable substance, then the Lewis Acid which is generated in situ on irradiation induces polymerization (see, for example, British Patent No. 1,321,263). However, the diazonium salts are not entirely satisfactory: the pot-life of the mixture of diazonium salt and cationically-polymerisable substance is often too short, particularly in daylight, and secondly, nitrogen is generated during liberation of the Lewis Acid catalyst, which evolution of gas restricts the range of processes in which the catalysts may successfully be employed.

Numerous proposals have therefore been made for the replacement of these diazonium salts by others which, while liberating an acid catalyst on irradiation, do not also evolve nitrogen: particularly intensively studied have been onium salts of sulfur, and iodonium salts.

Thus, it has recently been disclosed, in British Patent No. 1,516,511 and its United States equivalent, Pat. No. 4,058,401, that a mono-1,2-epoxide, an epoxide resin (i.e., a substance containing on average more than one 1,2-epoxide group), or a mixture thereof, may be polymerized or cured by means of a radiation-sensitive aromatic onium salt of oxygen, sulfur, selenium, or tellurium present in an amount capable of effecting the polymerisation or cure of the epoxide (or polyepoxide) by release of a Bronsted Acid catalyst when exposed to radiant energy. The only such salts described in the Specification are of the formula $$[(R)_a(R^1)_b(R^2)_cX]_d{}^+ \ [MQ_e]^{(e\text{-}f)-} \quad \text{I}$$

where
R denotes a monovalent aromatic radical,
$R^1$ denotes an alkyl, cycloalkyl, or substituted alkyl group,
$R^2$ denotes a polyvalent aliphatic or aromatic radical forming a heterocyclic or fused ring structure,
X denotes oxygen, sulfur, selenium, or tellurium,
M denotes an atom of a metal or metalloid, such as antimony, iron, tin, bismuth, aluminum, gallium, indium, titanium, zirconium, scandium, vanadium, chromium, manganese, boron, phosphorus, or arsenic,
Q denotes a halogen radical,
a denotes 0, 1, 2, or 3,
b denotes 0, 1, or 2,
c denotes 0 or 1, the sum of a+b+c being 3 or the valency of X,
d denotes (e-f),
f is the valency of M, and is an integer of from 2 to 7, and e is more than f and is an integer of up to 8.

Shortly afterwards, in British Patent Specification No. 1,518,141, and also in its corresponding U.S. Pat. No. 4,058,400, the same patentee disclosed that monomeric or prepolymeric, cationically polymerisable organic materials free from any 1,2-epoxide group, selected from vinyl monomers, vinyl prepolymers, cyclic ethers, cyclic esters, cyclic sulphides, cyclic amines, and organosilicon cyclics, can also be polymerized by exposing them to radiant energy in the presence of an effective amount of a radiation-sensitive onium salt of the Group VIA elements listed above. The only onium salts described are likewise of formula I above.

Still more recently, in its U.S. Pat. No. 4,102,687, the same patentee disclosed that the curing of urea-formaldehyde resins, melamine-formaldehyde resins, and phenol-formaldehyde resins could be initiated by exposing them to ultraviolet radiation in the presence of a Group VIA onium salt, curing being completed by heating. Again, only the onium salts of formula I are mentioned.

Subsequent disclosures of this patentee concerning onium salts of sulfur have been confined to sulfonium salts.

Thus, British Patent No. 1,535,492 describes the use of radiation-sensitive sulfonium salts of arylsulfonic, haloarylsulfonic, alkylsulfonic, and haloalkylsulfonic acids for the cationic polymerization of epoxide resins, vinyl monomers and prepolymers, cyclic organic ethers, cyclic organic esters, cyclic organic sulfides, cyclic amines, and cyclic organic silicon compounds.

Its U.S. Pat. No. 4,139,385 discloses the use of sulfonium and other salts in the curing of polyolefins by means of polythiols. A polyethylenically unsaturated compound, such as diallyl phthalate, diallyl maleate, or triallyl cyanurate, is mixed with a polythiol, such as trimethylolpropane trithioglycollate or pentaerythritol tetra(3-mercaptopropionate) and, e.g., triphenylsulfonium hexafluoroarsenate or tetrafluoroborate, and then exposed to ultraviolet light. The salts used as catalysts are all of the formula $$[(R)_a(R^1)_b I]^+ \ [MX_k]^{(k-m)-} \quad \text{II}$$

or $$[(R)_c(R^2)_e S]^+ \ [MX_k]^{(k-m)-} \quad \text{III}$$

or $$[(R)_f(R^4)_g(R^5)_h Z]^+ \ [MX_k]^{(k-m)-} \quad \text{IV}$$

where

R denotes a monovalent aromatic radical, $R^1$ denotes a divalent aromatic radical, $R^2$ denotes a polyvalent aliphatic or aromatic radical forming a heterocyclic or fused ring structure, $R^4$ denotes an alkyl, alkoxy, cycloalkyl, or substituted alkyl radical, $R^5$ denotes a polyvalent radical forming an aromatic, heterocyclic or fused ring structure, M denotes an atom of a metal or a metalloid, X denotes a halogen radical, Z denotes a nitrogen, phosphorus, arsenic, bismuth, or antimony atom, a denotes 0 or 2, b denotes 0 or 1, where $a+b=2$ or the valency of iodine, c denotes 0 or 3, d denotes 0 or 2, e denotes 0 or 1, such that $(c+d+e)=3$ or the valency of sulphur, f is an integer of from 0 to 4, g is 0, 1, or 2, h is 0, 1, or 2, such that $(f+g+h)=4$ or the valency of Z, j is $k-m$, m is the valency of M, being 2 to 7, and k is an integer of more than 1 but not more than 8.

Its West German Offenlegungsschrift No. 2 833 648 discloses that triarylsulfonium salts of formula

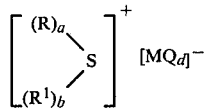

V can be used to initiate the curing, on irradiation, of an aliphatically-unsaturated composition containing a 1,2-epoxide group, such as glycidyl acrylate, or a mixture of an epoxide resin with an aliphatically-unsaturated substance such as methyl methacrylate, a polyester, or styrene. In formula V-

R denotes an aromatic hydrocarbon or heterocyclic group of 6 to 13 carbon atoms, which may be substituted, $R^1$ denotes a divalent aromatic hydrocarbon or heterocyclic group, which may be substituted, a is 1 or 3, b is 0 or 1, S has a valency of 3, which may be satisfied by R alone or by a combination of R and $R^1$, M denotes an atom of a metal or metalloid, Q denotes a halogen radical, and d is 4, 5, or 6.

Its U.S. Pat. No. 4,136,102 describes various sulfonium salts containing a hexafluorophosphate, hexafluoroarsenate, or hexafluoroantimonate anion and their use in curing epoxide resins. They are stated to be also useful for the polymerisation of a variety of unspecified cyclic organic and cyclic organo-silicon compounds.

Its West German Offenlegungsschrift No. 2 730 725 discloses the photo-induced curing, by means of aromatic onium salts, of epoxide resin compositions which also contain a polyvinyl acetal. The only onium salts of sulfur indicated are those of formula I.

Its U.S. Pat. No. 4,081,276 describes a process for the formation of photoresist images, especially for printed circuit production, wherein a layer of a photoinitiator is exposed to radiant energy and then contacted with a cationically polymerizable material, e.g., an epoxide resin. Again, the only onium salts of sulfur cited are those of formula I above.

Another patentee has described, in Belgian Pat. No. 845 746 the photopolymerization, using as catalyst an aromatic sulfonium salt or an aromatic iodonium salt, of mixtures comprising a compound having an epoxide functionality of more than 1.5 epoxide groups per molecule and a compound having hydroxy functionality of at least one.

This second patentee describes, in U.S. Pat. No. 4,090,936, photohardenable liquid compositions comprising (a) an organic compound having an average epoxide functionality in the range of about 1 to 1.3, (b) from about 3 to 50% by weight, calculated on the weight of (a), of an organic polymer which is compatible with (a) and has a glass transition temperature in the range of about $-20°$ C. to $105°$ C., being a polymer derived from at least one acrylate or methacrylate monomer, or a copolymer of styrene and allyl alcohol, or a polyvinyl butyral polymer, and (c) an aromatic complex salt photoinitiator which is an onium salt of a Group VA or Group VIA element or a halonium salt. The only onium salts of sulfur indicated are sulfonium salts.

Another disclosure of this second patentee, U.S. Pat. No. 4,069,054, relates to photopolymerizable compositions containing a cationically polymerizable monomer, an aromatic sulfonium compound, and an aromatic tertiary amine, aromatic tertiary diamine, or an aromatic polycyclic compound as a sensitizer.

An aromatic sulfonium salt, namely triphenylsulfonium hexafluorophospate, has been used commercially for the photopolymerization of epoxide resins.

We have now surprisingly found that cationically polymerizable materials can be photopolymerized by means of aryloxysulfoxonium salts. Use of these salts as catalysts generally results in faster photopolymerization than if the sulfonium or iodonium salts of the prior art are used. Further, contrary to what would be expected from the teachings of U.S. Pat. No. 4,102,687, we have found that urea-formaldehyde resins may be cured either by irradiation or by the application of heat.

A further advantage of the aryloxysulfoxonium salts is that compositions containing them, unlike those containing conventional sulfonium salts as catalysts, do not liberate obnoxious mercaptan odors on irradiation.

This invention accordingly provides compositions comprising (a) a compound, or mixture of compounds, capable of being transformed into a higher-molecular weight material under the influence of a cationic catalyst, (b) an effective amount of an aryloxysulfoxonium salt of the formula

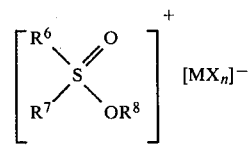

VI where either $R^6$ and $R^7$ each denote (i) an alkyl group of 1 to 6 carbon atoms, which may be substituted by a halogen atom and which may be interrupted in the chain by an ether oxygen atom or a sulfonyl group, (ii) an aryl group of 6 to 15 carbon atoms, or (iii) an aryloxy group of 6 to 15 carbon atoms, or $R^6$ and $R^7$ together denote a divalent group of 4 to 10 carbon atoms, forming with the indicated sulfur atom a heterocyclic radical, $R^8$ denotes an aryl group of 6 to 15 carbon atoms, M denotes an atom of a metal or metalloid, X denotes a halogen atom, preferably of fluorine or of chlorine, and n is 4, 5, or 6 and is one more than the valency of M.

Another aspect of this invention provides a process for the transformation into a higher-molecular weight material of a compound or mixture of compounds capable of being converted into a higher-molecular weight material under the influence of a cationic catalyst, comprising subjecting a said composition of this invention to actinic radiation.

We have further found that cationically polymerizable materials may also be polymerized by heating compositions of this invention.

Accordingly, a further aspect of this invention provides a process for the transformation into a higher-molecular weight material of a compound or mixture of compounds capable of being converted into a higher-molecular weight material under the influence of a cationic catalyst, which comprises heating a said composition of this invention.

Preferably $R^6$ and $R^7$, when taken separately, are each an aryl or aryloxy group of 6 to 11 carbon atoms, or taken together form a monocyclic chain composed only of carbon and hydrogen atoms. More preferably $R^6$ denotes a phenyl or naphthyl group, optionally substituted by one or two alkyl groups of 1 to 4 carbon atoms each or by one or two fluorine, chlorine, or bromine atoms. More preferably, too, $R^7$ denotes a phenyl, phenoxy, naphthyl, or naphthyloxy group, optionally substituted by one or two alkyl groups of 1 to 4 carbon atoms each or by one or two fluorine, chlorine, or bromine atoms. When $R^6$ and $R^7$ together denote a divalent group, more preferably this is a group $-\text{CH}_2)_4$.

$R^8$ more preferably denotes a phenyl or naphthyl group, optionally substituted by one or two alkyl or alkoxy groups of 1 to 4 carbon atoms each, by one or two nitro groups, or by one or two fluorine, chlorine, or bromine atoms.

M preferably denotes an atom of boron, phosphorus, arsenic, antimony, or bismuth, especially boron or phosphorus.

The anion $MX_n^-$ may be, e.g., hexachlorobismuthate, but it is preferably hexafluoroantimonate, hexafluoroarsenate, hexafluorophosphate, or tetrafluoroborate.

Specific examples of suitable sulfoxonium salts are: diphenylphenoxysulfoxonium hexafluorophosphate, phenyldiphenoxy-sulfoxonium hexafluorophosphate, methyldiphenoxysulfoxonium hexafluorophosphate, p-tolylphenoxy-p-tolyloxysulfoxonium hexafluorophosphate, ethyl(ethylsulfonylmethyl)-p-tolyloxy-sulfoxonium hexafluorophospate, o-chlorophenoxy-p-tolyl-p-phenoxysulfoxonium hexafluorophosphate, 1-phenoxy-1-oxidotetrahydrothiophenium hexafluorophosphate, 1-phenoxy-1-oxido-tetrahydrothiophenium tetrafluoroborate, and 1-phenoxy-1-oxidotetrahydrothiophenium hexafluoroantimonate.

Salts of formula VI are, in general, known (see Chalkey, Snodin, Stevens, and Whiting, *J. Chem. Soc.* (C), 1970, 682–6) and are obtainable by decomposition of the corresponding arenediazonium salt of formula $$R^8N_2^+ MX_n^- \qquad \text{VII}$$

in the presence of an excess of the appropriate sulfone or aryl ester of an alkanesulfonic acid or arenesulfonic acid of formula

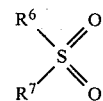
$$\qquad \text{VIII}$$

where $R^6$, $R^7$, $R^8$, M, X, and n have the meanings previously assigned, such as dimethyl sulfone, tetrahydrothiophen-1,1-dioxide, phenyl methanesulonate, or phenyl benzenesulonate.

The amount of (b) employed is sufficient to induce polymerization of (a) on exposure of the composition to actinic radiation or on heating it. Usually, from 0.1 to 7.5, especially from 0.5 to 6, parts by weight of (b) are employed per 100 parts by weight of component (a).

Component (a) is preferably a 1,2-epoxide, a vinyl monomer or prepolymer, an aminoplast, or a phenoplast. It may be, for example, a mono-1,2-epoxide, such as epichlorohydrin, propylene oxide, or a glycidyl ether of a monohydric alcohol or phenol, such as n-butyl glycidyl ether or phenyl glycidyl ether; it may also be, e.g., a glycidyl ester such as glycidyl acrylate or methacrylate.

Preferably it is an epoxide resin, especially those containing at least one group of formula

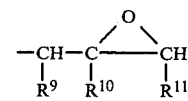
$$\qquad \text{IX}$$

directly attached to an atom of oxygen, where either $R^9$ and $R^{11}$ each represent a hydrogen atom, in which case $R^{10}$ denotes a hydrogen atom or a methyl group, or $R^9$ and $R^{11}$ together represent $-CH_2CH_2-$, in which case $R^{10}$ denotes a hydrogen atom.

As examples of such resins may be mentioned polyglycidyl and poly-($\beta$-methylglycidyl)esters obtainable by reaction of a compound containing two or more carboxylic acid groups per molecule with epichlorohydrin, glycerol dichlorohydrin, or $\beta$-methylepichlorohydrin in the presence of an alkali. Such polyglycidyl esters may be derived from aliphatic polycarboxylic acids, e.g., succinic acid, glutaric acid, adipic acid, pimelic acid, suberic acid, azelaic acid, sebacic acid, or dimerized or trimerized linoleic acid; from cycloaliphatic polycarboxylic acids such as tetrahydrophthalic acid, 4-methyltetrahydrophthalic acid, hexahydrophthalic acid, and 4-methylhexahydrophthalic acid, and from aromatic polycarboxylic acids such as phthalic acid, isophthalic acid, and terephthalic acid. Other suitable polyglycidyl esters are obtainable by vinyl polymerization of glycidyl esters of vinylic acids, especially glycidyl acrylate and glycidyl methacrylate.

Further examples are polyglycidyl and poly($\beta$-methylglycidyl)ethers obtainable by reaction of a compound containing at least two free alcoholic hydroxyl and/or phenolic hydroxyl groups per molecule with the appropriate epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene)-glycols, propane-1,2-diol and poly(oxypropylene)-glycols, propane-1,3-diol, poly(oxytetramethylene)-glycols, pentane-1,5-diol, hexane-2,4,6-triol, glycerol, 1,1,1-trimethylolpropane, pentaerythritol, sorbitol, and poly(epichlorohydrin); from cycloaliphatic alcohols such as resorcitol, quinitol, bis(4-hydroxycyclohexyl)methane, 2,2-bis(hydroxycyclohexyl)propane, and 1,1-bis(hydroxymethyl)cyclohex-3-ene; and from alcohols having aromatic nuclei, such as N,N-bis(2-hydroxyethyl)aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane, 4,4'-dihydroxydiphenyl, bis(4-hydroxyphenyl)sulfone, 1,1,2,2-tetrakis(4-hydroxyphenyl)ethane, 2,2-bis(4-hydroxyphenyl)propane, (otherwise known as bisphenol A), 2,2-bis(3,5-dibromo-4-hydroxyphenyl)propane, and novolaks formed from aldehydes such as formaldehyde, acetaldehyde, chloral, and furfuraldehyde, with phenol itself, and phenol substituted in the ring by chlorine atoms or by alkyl groups each containing up to nine carbon atoms, such as 4-chlorophenol, 2-methylphenol, and 4-tert.butylphenol.

Poly(N-glycidyl)compounds may also be used, e.g., N-glycidyl derivatives of amines such as aniline, n-butylamine, bis(4-aminophenyl)methane, and bis(4-methylaminophenyl)methane; triglycidyl isocyanurate; and N,N'-diglycidyl derivatives of cyclic alkylene ureas, such as ethyleneurea and 1,3-propyleneurea, and of hydantoins such as 5,5'-dimethylhydantoin. In general, however, they are not preferred.

Poly(S-glycidyl)compounds may also be used, e.g., di(S-glycidyl)derivatives of dithiols such as ethane-1,2-dithiol and bis(4-mercaptomethylphenyl)ether, but they also are not preferred.

Examples of epoxide resins having groups of formula IX where $R^9$ and $R^{11}$ conjointly denote a —CH$_2$CH$_2$— group are bis(2,3-epoxycyclopentyl)ether, 2,3-epoxycyclopentyl glycidyl ether, and 1,2-bis(2,3-epoxycyclopentyloxy)ethane.

Epoxide resins having the 1,2-epoxide groups attached to different kinds of hetero atoms may be employed, e.g., the glycidyl ether-glycidyl ester of salicylic acid.

Epoxide resins in which some or all of the epoxide groups are not terminal may also be employed, such as vinylcyclohexene dioxide, limonene dioxide, dicyclopentadiene dioxide, 4-oxatetracyclo[6.2.1.0$^{2,7}$.0.$^{3,5}$]undec-9-yl glycidyl ether, 1,2-bis(4-oxatetracyclo[6.2.1.0$^{2,7}$.0.$^{3,5}$]undec-9-yloxy)ethane, 3,4-epoxycyclohexylmethyl 3',4'-epoxycyclohexanecarboxylate and its 6,6'-dimethyl derivative, ethylene glycol bis(3,4-epoxycyclohexanecarboxylate), 3-(3,4-epoxycyclohexy)-8,9-epoxy-2,4-dioxaspiro[5,5] undecane, and epoxidised butadienes or copolymers of butadiene with ethylenic compounds such as styrene and vinyl acetate.

If desired, a mixture of epoxide resins may be used.

Especially preferred epoxide resins used in this invention are diglycidyl ethers, which may have been advanced, of dihydric phenols such as 2,2-bis(4-hydroxyphenyl)propane and bis(4-hydroxyphenyl)methane and of dihydric alcohols such as butane-1,4-diol.

If desired, the epoxide resin may be co-cured with a polyhydric alcohol, i.e., a compound having at least two alcoholic hydroxyl, preferably primary, groups per molecule. Preferably the polyhydric alcohol is present in a quantity sufficient to supply from 0.5 to 1.5, especially 0.75 to 1.25, alcoholic hydroxyl groups per 1,2-epoxide group of the epoxide resin. The polyhydric alcohol preferably contains, in addition to the alcoholic hydroxyl groups, only carbon, hydrogen, and, optionally, oxygen present as ether oxygen, acetal or carbonyloxy groups, and halogen atoms. It is further preferred that the polyhydric alcohols have a molecular weight of at least 100 and particularly more than 1000. Examples of suitable polyhydric alcohols are poly(oxyethylene)glycols, poly(oxypropylene)glycols, poly(oxytetramethylene)glycols, polyepichlorohydrins, poly(oxyethylene)-, poly(oxypropylene)-, and poly(oxytetramethylene)triols, obtainable by polymerization of ethylene oxide, propylene oxide, or tetrahydrofuran in the presence of glycerol or 1,1,1-trimethylolpropane, hydroxyl-terminated polycaprolactones, copolymers of styrene with allyl alcohol, polyvinyl alcohols, hydroxypropylcellulose, hydroxy-containing polyvinyl acetals, and partial esters of cellulose, e.g., a cellulose acetate butyrate.

Vinyl monomers and prepolymers which may be polymerised include styrene, α-methylstyrene, allylbenzene, divinylbenzene, vinylcyclohexane, 4-vinylcyclohex-1-ene, N-vinylpyrrolidin-2-one, N-vinylcarbazole, acrolein, isoprene, butadiene, piperylene, vinyl acetate, and vinyl ethers such as isobutyl vinyl ether, methyl vinyl ether, trimethylolpropane trivinyl ether, glycerol trivinyl ether, vinyl ethers of ethylene glycol and poly(oxyethylene glycols), and cyclic vinyl ethers having at least two cyclic vinyl ether groups each forming part of a 3,4-dihydro-2H-pyran nucleus, such as 3,4-dihydro-2H-pyran-2-ylmethyl 3,4-dihydro-2H-pyran-2-carboxylate and its prepolymers. The preferred vinyl compounds are vinyl ethers of aliphatic monohydric alcohols and 3,4-dihydro-2H-pyran-2-ylmethyl 3,4-dihydro-2H-pyran-2-carboxylate and its prepolymers.

The aminoplasts preferred as component (a) contain, per molecule, at least two groups of formula —CH$_2$OR$^{12}$ directly attached to an amidic or thioamidic nitrogen atom or atoms, where $R^{12}$ denotes a hydrogen atom, an alkyl group of 1 to 4 carbon atoms, or an acetyl group. Examples of such aminoplasts are the N-hydroxymethyl, N-methoxymethyl, N-butoxymethyl, and N-acetoxymethyl derivatives of the following amides and amide-like substances.

1. Urea, thiourea, and the cyclic ureas having the formula

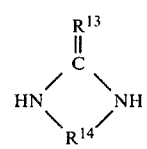

X in which
$R^{13}$ denotes oxygen or sulfur and
$R^{14}$ denotes either a group of formula

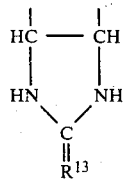

or a divalent group which may be substituted by methyl, methoxy, or hydroxy groups, and which may be interrupted by —CO—, —O—, or —N($R^{15}$)—, where $R^{15}$ denotes an alkyl or hydroxyalkyl group containing up to 4 carbon atoms, said divalent group containing 2 to 4 carbon atoms other than those in any methyl or methoxy substituents or interrupting —CO— or —N($R^{15}$)— groups.

Examples of such cyclic ureas are ethyleneurea(imidazolidin-2-one, dihydroxyethyleneurea (4,5-dihydroxyimidazolidin-2-one), hydantoin, uron(tetrahydro-oxadiazin-4-one), 1,2-propyleneurea(4-methylimidazolidin-2-one), 1,3-propyleneurea(hexahydro-2H-pyrimid-2-one), hydroxypropyleneurea(5-hydroxyhexahydro-2H-pyrimid-2-one), dimethylpropyleneurea(5,5-dimethylhexahydro-2H-pyrimid-2-one), dimethylhydroxypropyleneurea and dimethylmethoxypropyleneurea(4-hydroxy- and 4-methoxy-5,5-dimethylhexahydro-2H-pyrimid-2-one), 5-ethyltriazin-2-one, and 5-(2-hydroxyethyl)triazin-2-one.

II Carbamates and dicarbamates of aliphatic monohydric and dihydric alcohols containing up to four carbon atoms, e.g., methyl, ethyl, isopropyl, 2-hydroxyethyl, 2-methoxyethyl, 2-hydroxy-n-propyl and 3-hydroxyl-n-propyl carbamates, and ethylene and 1,4-butylene dicarbamates.

III. Melamine and other polyamino-1,3-triazines such as acetoguanamine, benzoguanamine, and adipoguanamine.

If desired, aminoplasts containing both N-hydroxymethyl and N-alkoxymethyl, or N-hydroxymethyl and N-acetoxymethyl, groups may be used (for example, a hexamethylolmelamine in which 1 to 3 of the hydroxyl groups have been etherified with methyl groups).

The preferred aminoplasts are condensation products of urea, uron, hydantoin, or melamine with formaldehyde, and the partially or fully etherified products of such condensation products with an aliphatic monohydric alcohol of 1 to 4 carbon atoms.

The preferred phenoplasts are resols made from a phenol and an aldehyde. Suitable phenols include phenol itself, resorcinol, 2,2-bis(p-hydroxyphenyl)propane, p-chlorophenol, a phenol substituted by one or two alkyl groups, each of 1 to 9 carbon atoms, such as o-, m-, and p-cresol, the xylenols, p-tertiary butylphenol, p-nonylphenol, and phenyl-substituted phenols, especially p-phenylphenol. The aldehyde which is condensed with the phenol is preferably formaldehyde, but other aldehydes such as acetaldehyde and furfuraldehyde may also be used. If desired, a mixture of such curable phenol-aldehyde resins may be used.

The preferred resols are condensation products of phenol, p-chlorophenol, resorcinol, or o-, m-, or p-cresol with formaldehyde.

Preferably the compositions of this invention, when they are to be photopolymerized, also contain a sensitizer. We have found that, by incorporation of suitable sensitizers, the speed of curing is yet further increased, thereby permitting the use of even shorter exposure times and/or of less powerful sources of irradiation. Further, the sensitivity to visible light is enhanced. Sensitizers other than dyes have been found the more effective, particularly aromatic polycyclic compounds having at least three fused benzene rings and having an ionization energy of less than about 7.5 ev. Suitable such sensitizers are described in U.S. Pat. No. 4,069,054, and include anthracene, rubrene, perylene, phenanthrene, fluoranthene, and pyrene. We prefer to include from 0.1 to 2%, and especially from 0.25 to 0.75%, by weight of the sensitizer, calculated on the weight of (a).

In the photopolymerizing step, actinic radiation of wavelength from 200 to 600 nm is preferably used. Suitable sources of actinic radiation include carbon arcs, mercury vapor arcs, fluorescent lamps with phosphors emitting ultraviolet light, argon and xenon glow lamps, tungsten lamps, and photographic flood lamps. Of these, mercury vapor arcs, particularly sun lamps, fluorescent sun lamps, and metal halide lamps are most suitable. The time required for the exposure will depend upon a variety of factors which include, for example, the individual polymerizable substrate used, the type of light source, and its distance from the irradiated material. Suitable times may be readily determined by those familiar with photopolymerization techniques. If, as in the process described below, it is necessary that the product so photopolymerized must still be curable on heating with the heat-curing agent admixed therewith, then, of course, irradiation is carried out at a temperature below that at which substantial heat-curing of the photopolymerized product by means of that heat-curing agent would occur.

When the compositions of this invention are to be polymerized substantially by means of heat alone, they are preferably heated to a temperature of from 100° to 175° C., and preferably for from 3 to 20 minutes.

The compositions of this invention may be used as surface coatings. They may be applied to a substrate such as steel, aluminum, copper, cadmium, zinc, paper, or wood, preferably as a liquid, and irradiated or heated. By photopolymerizing part of the coating, as by irradiation through a mask, those sections which have not been exposed may be washed with a solvent to remove the unpolymerized portions while leaving the photopolymerized, insoluble portions in place. Thus the compositions of this invention may be used in the production of printing plates and printed circuits. Methods of producing printing plates and printed circuits from photopolymerisable compositions are well known (see, e.g., our British Patent No. 1 495 746).

The compositions may also be used as adhesives. A layer of the composition may be sandwiched between two surfaces of objects, at least one of which is transparent to the actinic radiation, e.g., of glass, when photopolymerization is to be employed, then the assembly is heated, or irradiated and, if desired, heated to complete the polymerization.

The compositions are also useful in the production of fiber-reinforced composites, including sheet moulding compounds.

They may be applied directly, in liquid form, to reinforcing fiber (including strands, filaments, and whiskers), which may be in the form of woven or nonwoven cloth, unidirectional lengths, or chopped strands, especially glass, boron, stainless steel, tungsten, alumina, silicon carbide, asbestos, potassium titanate whiskers, an aromatic polyamide such as poly(m-phenylene isophthalamide), poly(p-phenylene terephthalamide), or poly(p-benzamide), polyethylene, polypropylene, or carbon.

The fiber-reinforced composite may be made by a batch process, the fibrous reinforcing material being laid on a film of the photopolymerized composition, which is advantageously under slight tension, when a second such film may, if desired, be laid on top, and then the assembly is pressed while being heated. It may also be made continuously, such as by contacting the fibrous reinforcing material with a film of the photopolymerized composition, then, if desired, placing a second such film on the reverse face of the fibrous reinforcing material and applying heat and pressure. More conveniently, two such films, preferably supported on the reverse side by belts or strippable sheets, are applied simultaneously to the fibrous reinforcing material so as to contact each exposed face. When two such films are applied, they may be the same or different.

Multilayer composites may be made by heating under pressure interleaved films and layers of one or more fibrous reinforcing materials. When unidirectional fibers are used as the reinforcement material, successive layers of them may be oriented to form cross-ply structures.

With the fibrous reinforcing material there may be used additional types of reinforcement such as a foil of metal (e.g., aluminum, steel, or titanium) or a sheet of a plastics material (e.g., an aromatic or aliphatic polyamide, a polyimide, a polysulfone, or a polycarbonate) or of a rubber (e.g., a neoprene or acrylonitrile rubber).

Alternatively, a mixture of the reinforcing fibers and a composition of this invention is heated to form a composite directly.

In the production of sheet moulding compounds, a composition of this invention, together with the chopped strand reinforcing material and any other components, is exposed to irradiation in layers through supporting sheets or is heated.

The polymerizable composition is preferably applied so that the composite contains a total of from 20 to 80% by weight of the said composition and, correspondingly, 80 to 20% by weight of the reinforcement. More preferably, a total of 30 to 50% by weight of the composition is employed.

The compositions of this invention are useful in the production of putties and fillers. They may be used as dip-coatings, an article to be coated being dipped in the liquid composition, withdrawn, and the adhering coating being heated, or being irradiated to photopolymerize (and hence solidify it) and subsequently, if desired, being heated.

We have found that it is possible, using aryloxysulfoxonium salts, to cure epoxide resins and phenoplasts in two stages; the resin is first converted into the partially cured B-stage by exposing it to actinic radiation in the presence of an aryloxysulfoxonium salt and a latent, heat-activated crosslinking agent for the epoxide resin or phenoplast, and, in a second stage, the partially cured composition is heated so that curing is completed by means of the heat-activated crosslinking agent. Thus, a liquid or semiliquid composition may be prepared, which may then be shaped or used to impregnate a substrate while being irradiated to solidify it; then the solidified body is heated when desired, to complete the cure of the resin.

According, therefore, to another embodiment of this invention, an epoxide resin or a phenoplast is irradiated in the presence of an amount of an aryloxysulfoxonium salt of formula VI effective for the polymerization of the epoxide resin or phenoplast and of a curing amount of a latent heat-curing agent for the epoxide resin or phenoplast to form a B-stage product, and, when desired, curing of the composition is completed by heating it.

A further embodiment comprises a composition containing an epoxide resin or a phenoplast, an amount of an aryloxysulfoxonium salt of formula VI effective for polymerization of the said epoxide resin or phenoplast on exposure of the composition to actinic radiation, and a curing amount of a latent heat-curing agent for the epoxide resin or phenoplast.

Suitable heat-activated crosslinking agents for the epoxide resin compositions include polycarboxylic acid anhydrides, complexes of amines, especially primary or tertiary aliphatic amines such as ethylamine, trimethylamine, and n-octyldimethylamine, with boron trifluoride or boron trichloride, and latent boron difluoride chelates. Aromatic polyamines and imidazoles are usually not preferred, because indifferent results are obtained, possibly due to reaction between the acid catalyst liberated and the amine. Dicyandiamine can be used successfully, providing it is in relatively coarse particles.

Suitable heat-activated crosslinking agents for resols include hexamethylenetetramine and paraform.

The temperature and duration of heating required for the thermal curing after photopolymerization, and the proportions of heat-activated curing agent, are readily found by routine experimentation and easily derivable from what is already well known concerning the heat-curing of epoxide resins and phenol-aldehyde resols.

Compositions containing resins having epoxide groups or phenolic hydroxyl groups through which they can be heat-cured after photopolymerisation are particularly useful in the production of multilayer printed circuits.

Conventionally, a multilayer printed circuit is prepared from several double-sided printed circuit boards of copper, stacked one on top of another and separated from each other by insulating sheets, usually of glass fiber impregnated with an epoxide resin or a phenol-formaldehyde resin in the B-stage. If a heat-curing agent is not admixed with the layer of photopolymerizable resin in the circuit board, it can be incorporated in the insulating layers which alternate with the plates, these layers conveniently being of an epoxide resin or phenol-formaldehyde resin prepreg; sufficient of the heat-curing agent contained in the prepreg, providing the latter is not too thick, migrates to induce crosslinking of the photopolymerized epoxide resin or phenol-formaldehyde resin. The stack is heated and compressed to bond the layers together. Conventional photopolymerisable materials, however, do not form strong bonds either with copper or with resin-impregnated glass fiber sheets. A stack which is bonded with the photopolymer still covering the copper is therefore inherently weak and in use can become delaminated. It is therefore normal practice to remove the residual photopolymer after the etching stage, either by means of powerful solvents or by a mechanical method, e.g., by means of brushes. Such a stripping process can damage the copper of the printed circuit or the surface of the laminate on which the circuit rests, and so there is a need for a method which would avoid the necessity of removing the photopolymerized material prior to bonding the boards together. The presence of residual crosslinking groups in the compositions of this invention means that crosslinking can occur when the boards are bonded, resulting in good adhesion to the copper and to the resin-impregnated glass fibre substrate, so avoiding the necessity just referred to; also, products with a higher glass transition temperature are obtained.

Another application involving heat-curing after photopolymerization of the compositions of this invention is in filament winding. Thus, a continuous tow of fibrous reinforcement is impregnated with a composition containing a latent heat-curing agent and then wound around a mandrel or former while exposing the winding to actinic radiation. Such filament windings still have a degree of flexibility, permitting the mandrel or former to be removed more readily than when a rigid winding is formed in one step. When required, the winding is heated to crosslink the composition.

In a further such application, a layer of the composition in liquid form is irradiated until it solidifies, producing a film adhesive, which is then placed between, and in contact with, two surfaces which are to be bonded together, and the assembly is heated to complete crosslinking of the composition. The film may be provided on one face with a strippable backing sheet, e.g., of a polyolefin or a polyester, or of cellulosic paper having a coating of a silicone release agent. Manipulation of the assembly is often easier if the film has a tacky surface. This may be produced by coating the film with a substance which is tacky at room temperature but which crosslinks to a hard, insoluble, infusible resin under the conditions of heat employed to complete crosslinking of the composition. However, an adequate degree of tackiness often exists without additional treatment, especially if polymerization of the composition has not proceeded too far. Suitable adherends include metals such as iron, zinc, copper, nickel, and aluminium, ceramics, glass, and rubbers.

The following Examples illustrate the invention. Unless otherwise indicated, parts are by weight.

Aryloxysulfoxonium salts employed in these Examples were prepared as described by Chalkley et al., loc.cit.

EXAMPLE 1

A curable composition was prepared by forming a mixture of 50 parts of 2,2-bis(4-glycidyloxphenyl)propane, 30 parts of 3,4-epoxycyclohexylmethyl 3,4-epoxycyclohexanecarboxylate, 20 parts of 1,4-bis(-glycidyloxy)butane, and 2 parts of phenoxy-p-tolyl-p-tolyloxysulfoxonium hexafluorophosphate. A film 10 μm thick of this composition was drawn on tinplate and exposed to ultraviolet irradiation by passing once through a 'Mini-cure' apparatus (Primarc Ltd.) containing two medium pressure mercury arc lamps (80 w per cm) and operating at a belt speed of 30 meters per minute. The resin cured to a hard, solvent-resistant film in less than three seconds, i.e., it withstood more than twenty rubs with a cotton wool swab which had been soaked in acetone.

EXAMPLE 2

A portion of the curable composition prepared in Example 1 was applied to a 1 mm thick glass plate to a thickness of 10 μm. Another plate of glass was placed on top of the first, and the assembly was exposed to irradiation from a Primarc 80 w per cm medium pressure mercury arc lamp at a distance of 8 cm. After an exposure time of 5 seconds the glass plates were permanently bonded together.

EXAMPLE 3

There were added 2 parts of phenoxy-p-tolyl-p-tolyloxysulfoxonium hexafluorophosphate to 100 parts of 3,4-dihydro-2H-pyran-2-ylmethyl 3,4-dihydro-2H-pyran-2-carboxylate. After the components had been mixed thoroughly, the mixture was applied as a film 10 μm thick to tinplate. Exposure of this for 5 seconds to the irradiation from a 80 w per cm medium pressure mercury arc lamp at a distance of 8 cm produced a hard, tack-free coating.

EXAMPLE 4

There were added 2 parts of phenoxy-p-tolyl-p-tolyloxysulfoxonium hexafluorophosphate to 100 parts of a commercially available phenol-formaldehyde resol having a P:F ratio of 1:1.6. Irradiation of the mixture as a 10 μm film under the conditions described in Example 3 produced a hard clear film after 5 seconds.

EXAMPLE 5

There were added 2 parts of phenoxy-p-tolyl-p-tolyloxysulfoxonium hexafluorophosphate to 100 parts of a commercially-available, highly condensed, urea-formaldehyde resin of urea: formaldehyde ratio 1:1.4. Irradiation of the mixture as a 10 μm film under the conditions described in Example 3 produced a tack-free coating after 5 seconds. When the sulfoxonium salt was omitted, the resin remained tacky on irradiation and could readily be removed by wiping or with water.

EXAMPLE 6

A portion of a composition comprising 2 parts of phenoxy-p-tolyl-p-tolyloxysulfoxonium hexafluorophosphate and 100 parts of 2,2-bis(4-glycidyloxyphenyl)propane was applied as a 10 μm film to tinplate. This layer was exposed to the irradiation from a 400 w high pressure metal halide quartz lamp (providing radiation predominantly in the 365 mμ band) at a distance of 22 cm. After 5 minutes' exposure, a slightly tacky film was produced which became tack-free on standing for a further 5 minutes. To another portion of the above mixture was added 0.5% of pyrene. Exposure of this mixture as a 10 μm film to the same irradiation conditions as the mixture without pyrene produced a tack-free coating after 45 seconds' irradiation. This film could not be removed with acetone.

EXAMPLE 7

Irradiation of a mixture comprising 2 parts of 1-phenoxy-1-oxidotetrahydrothiophenium hexafluorophosphate and 100 parts of 2,2-bis(4-glycidyloxyphenyl)propane as a film 10 μm thick under the conditions described in Example 2 produced a tack-free coating after 20 seconds' irradiation.

EXAMPLE 8

The procedure of Example 7 was repeated, using in place of the hexafluorophosphate 2 g of 1-phenoxy-1-oxidotetrahydrothiophenium tetrafluoroborate. A tack-free coating was obtained after irradiation for one minute.

EXAMPLE 9

There was added 1 part of p-chlorophenoxy-p-tolylphenoxysulphoxonium hexafluorophosphate to 100 parts of 3,4-epoxycyclohexylmethyl 3,4-epoxycyclohexanecarboxylate. Exposure of the mixture as a 10 μm film to irradiation under the conditions described in Example 2 produced a hard, solvent-resistant coating after less than 1 second's irradiation.

EXAMPLE 10

A mixture of 1 part of phenyldiphenoxysulphoxonium hexafluorophosphate and 100 parts of 2,2-bis(4-glycidyloxyphenyl)-propane was exposed as a 10 μm film to irradiation under the conditions described in Example 2, producing a hard, solvent-resistant coating after less than 1 second's irradiation.

EXAMPLE 11

There was added 1 part of methyldiphenoxysulfoxonium hexafluorophosphate to 100 parts of 2,2-bis(4-glycidyloxyphenyl)-propane. Following the procedure of Example 2, a fully cured coating was obtained after 5 seconds' irradiation.

EXAMPLE 12

Example 11 was repeated, using, however, 1 part of diphenylphenoxysulfoxonium hexafluorophosphate instead of the methyldiphenoxy analogue. A hard, cured, adherent film was formed after 10 seconds' exposure.

EXAMPLE 13

The procedure of Example 2 was followed, using a coating 10 μm thick of a mixture comprising 2 parts of 1-phenoxy-1-oxidotetrahydrothiophenium hexafluoroantimonate and 100 parts of 2,2-bis(4-glycidyloxyphenyl)propane. A tack-free coating was produced after irradiation for 10 seconds.

EXAMPLE 14

The procedure of Example 1 was repeated except that the "Mini-Cure" apparatus was operated at a belt speed of 90 meters per minute. The resin cured to a hard, solvent-resistant coating within 19 seconds.

To another portion of the above composition was added 0.5% of pyrene. Exposure of this mixture to the same irradiation conditions produced a tack-free coating after only 10 seconds.

EXAMPLE 15

A liquid composition was prepared by forming a mixture of 75 parts of 2,2-bis(4-glycidyloxyphenyl)propane, 25 parts of a polyglycidyl ether of a phenol-formaldehyde novolak having an epoxide content of 5.6 equiv./kg, 4 parts of the boron trichloride complex of n-octyldimethylamine, and 2 parts of p-chlorophenoxy-p-tolylphenoxysulfoxonium hexafluorophosphate. This curable composition was used to make a prepreg by impregnating glass cloth (square weave) with it and then exposing both sides to the irradiation from a 80 w per cm medium pressure mercury arc lamp at a distance of 8 cm for 5 seconds. A 6-ply glass cloth laminate was prepared by pressing six 10 cm-square pieces of the prepreg at 120° for 1 hour at a pressure of 2.1 $MN/m^2$. This laminate, which consisted of 58% of glass, had an interlaminar shear strength of 448 $MN/m^2$.

EXAMPLE 16

A solution of 1 g of the diglycidyl ether of 2,2-bis(p-hydroxyphenyl)propane (having an epoxide content of 5.3 equiv./kg), 4 g of the tetraglycidyl ether of 1,1,2,2-tetra(p-hydroxyphenyl)ethane (having an epoxide content of 5.2 equiv./kg), 5 g of a diglycidyl ether of 2,2-bis(p-hydroxyphenyl)propane which had been advanced with a bromine-containing phenol to a softening point of about 50° C. and had an epoxide content of 2 equiv./kg, and 0.1 g of p-chlorophenoxy-p-tolylphenoxysulfoxonium hexafluorophosphate in 10 g of a cyclohexanone was prepared. A copper-clad laminate was coated with this composition and the solvent was allowed to evaporate, leaving a film about 10 μm thick. This film was irradiated for 10 minutes through a negative using a 500 w medium pressure mercury lamp at a distance of 22 cm. After irradiation the image was developed in toluene, washing away the unexposed areas to leave a good relief image on the copper. The uncoated copper areas were then etched using an aqueous solution of ferric chloride (41% w/w $FeCl_3$) at 35° C., leaving the coated areas intact.

EXAMPLE 17

This Example illustrate the co-curing of an epoxide resin with a polyhydric alcohol on irradiation.

A composition comprising 100 parts of 3,4-epoxycyclohexylmethyl 3,4-epoxycyclohexanecarboxylate, 100 parts of a commercially available styrene-allyl alcohol copolymer of hydroxyl content 3.56 equiv./kg. ("RJ100" of Monsanto Chemical Co.), and 2 parts of p-chlorophenoxy-p-tolylphenoxysulfoxonium hexafluorophosphate was applied as a coating 10 μm thick on tinplate and exposed to irradiation from a medium pressure mercury arc lamp (80 w per cm). A tack-free flexible coating was formed in 2 seconds.

EXAMPLE 18

In this Example, the efficacy of catalysts of the present invention in inducing photopolymerisation is compared with that of prior art catalysts.

Compositions were prepared from 2 parts of catalyst, 50 parts of 2,2-bis(4-glycidyloxyphenyl)propane, 30 parts of 3,4-epoxycyclohexylmethyl 3,4-epoxycyclohexanecarboxylate, and 20 parts of 1,4-diglycidyloxybutane. Films 10 μm thick were drawn on tinplate and exposed to ultraviolet irradiation by passing twice through a "Minicure" unit (as described in Example 1) which operated at a belt-speed of 60 meters/minute. The irradiation times needed for the coatings to become tack-free are given in the following Table.

| Composition | Catalyst | time to become tack free (seconds) |
|---|---|---|
| a | phenoxy-p-tolyl-p-tolyloxy-sulfoxonium hexafluorophosphate | 7 |
| b | phenyldiphenoxysulfoxonium hexafluorophosphate | 13 |
| c | triphenylsulfonium hexafluorophosphate | 42 |
| d | 3,3'-dinitrodiphenyliodonium hexafluorophosphate | 45 |

Triphenylsulfonium hexafluorophosphate has, as stated above, been employed commercially in the photopolymerization of epoxide resins. Of iodonium salts proposed in the patent literature mentioned above as also suitable for photopolymerizing epoxide resins, 3,3'-dinitrodiphenyliodonium hexafluorophosphate was shown, in unpublished experiments of the present inventors, to be one of the more active.

The superiority of the sulfoxonium salts used in compositions a and b over those of the prior art is clearly demonstrated.

EXAMPLE 19

This, and succeeding Examples, illustrate thermal curing of compositions of this invention.

1-Phenoxy-1-oxidotetrahydrothiophenium hexafluorophosphate (2 parts) was milled with 98 parts of 2,2-bis(4-glycidyloxyphenyl)-propane. A 15 g-sample of the mixture was still fluid and had not gelled after being heated at 60° C. for 24 hours; 15 g-samples heated at 110° C. and at 150° C. cured in 17 minutes and 6 minutes respectively, showing the compositions to be latent (i.e., to have long storage lives in the uncured state at about room temperature but to cure rapidly on heating at elevated temperature).

EXAMPLE 20

A composition comprising 2 parts of phenyldiphenoxysulfoxonium hexafluorophosphate and 98 parts of 3,4-epoxycyclohexylmethyl 3,4-epoxycyclohexanecarboxylate was applied as a film 10 μm thick on tinplate and heated at 120° C. for 15 minutes. A hard, tack-free coating was obtained.

EXAMPLE 21

A mixture of 2 parts of 1-phenoxy-1-oxidotetrahydrothiophenium hexafluorophosphate and 98 parts of the phenol-formaldehyde resol employed in Example 4 was heated, as a layer 10 μm thick on tinplate, for 15 minutes at 110° C. A hard coating, resistant to acetone, was produced.

We claim:
1. Compositions comprising
   (a) a compound, or mixture of compounds, capable of being transformed into a higher-molecular weight material under the influence of a cationic catalyst, and
   (b) an effective amount of an aryloxysulfoxonium salt of the formula

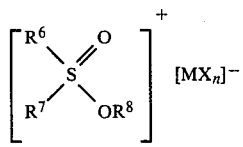

where
either $R^6$ and $R^7$ each denote
   (i) an alkyl group of 1 to 6 carbon atoms, which may be substituted by a halogen atom and which may be interrupted in the chain by an ether oxygen atom or a sulphonyl group,
   (ii) an aryl group of 6 to 15 carbon atoms, or
   (iii) an aryloxy group of 6 to 15 carbon atoms, or $R^6$ and $R^7$ together denote a divalent group of 4 to 10 carbon atoms forming with the indicated sulfur atom a heterocyclic radical,
$R^8$ denotes an aryl group of 6 to 15 carbon atoms,
M denotes an atom of a metal or metalloid,
X denotes a halogen atom, and
n is 4, 5, or 6 and is one more than the valency of M.

2. A composition according to claim 1, wherein $R^6$ and $R^7$ are each an aryl or aryloxy group of 6 to 11 carbon atoms.

3. A composition according to claim 1, wherein $R^6$ and $R^7$ together form a monocyclic chain composed only of carbon and hydrogen atoms.

4. A composition according to claim 1, where $R^8$ denotes a phenyl or naphthyl group, optionally substituted by one or two alkyl or alkoxy groups of 1 to 4 carbon atoms each, by one or two nitro groups, or by one or two fluorine, chlorine or bromine atoms.

5. A composition according to claim 1, wherein M denotes an atom or boron, phosphorus, arsenic, antimony, or bismuth and X denotes fluorine or chlorine.

6. A composition according to claim 1, wherein (b) is diphenylphenoxysulfoxonium hexafluorophosphate, diphenyldiphenoxysulfoxonium hexafluorophosphate, methyldiphenoxysulfoxonium hexafluorophosphate, p-tolylphenoxy-p-tolyloxysulfoxonium hexafluorophosphate, ethyl(ethylsulfonylmethyl)-p-tolyloxysulfoxonium hexafluorophosphate, p-chlorophenoxy-p-tolylphenoxysulfoxonium hexafluorophosphate, 1-phenoxy-1-oxidotetrahydrothiophenium hexafluorophosphate, 1-phenoxy-1-oxidotetrahydrothiophenium tetrafluoroborate, or 1-phenoxy-1-oxidotetrahydrothiophenium hexafluoroantimonate.

7. A composition according to claim 1, wherein (a) is a 1,2-epoxide, a vinyl monomer or prepolymer, an aminoplast, or a phenoplast.

8. A composition according to claim 1, wherein (a) is an epoxide resin or a resol resin made from a phenol and an aldehyde.

9. A composition according to claim 1, containing 0.1 to 7.5 parts by weight of (b) per 100 parts by weight of (a).

10. A composition according to claim 8, which also contains a curing amount of a latent heat-curing agent for the epoxide resin or for the resol resin.

* * * * *